United States Patent [19]

Spencer

[11] Patent Number: 5,001,109

[45] Date of Patent: Mar. 19, 1991

[54] CERAMIC COMPOSITION

[75] Inventor: Nicholas D. Spencer, Washington, D.C.

[73] Assignee: W. R. Grace & Co.-Conn., New York, N.Y.

[21] Appl. No.: 324,482

[22] Filed: Mar. 16, 1989

Related U.S. Application Data

[63] Continuation-in-part of Ser. No. 201,988, Jun. 3, 1988, which is a continuation-in-part of Ser. No. 155,340, Feb. 12, 1988, which is a continuation-in-part of Ser. No. 95,083, Sep. 11, 1987, abandoned.

[51] Int. Cl.$^5$ .............................................. H01L 39/12
[52] U.S. Cl. ......................................... 505/1; 505/738
[58] Field of Search ........................... 505/1, 734–741, 505/776–785; 427/192, 215

[56] References Cited

U.S. PATENT DOCUMENTS

| | | | |
|---|---|---|---|
| 4,839,339 | 4/1989 | Bunker et al. | 505/1 |
| 4,880,771 | 4/1989 | Cava et al. | 505/1 |
| 4,894,361 | 6/1989 | Subramanian | 505/1 |

OTHER PUBLICATIONS

Hongbao, "Superconducting Properties in $(Bi_{2-x-y}Pb_xSb_y)Sr_2Ca_2CuO_z$ System", 10/15/88 submitted to Physica Co, Preprint.
Hongbao "Zero Resistance at B2K in the Multiphase System of BiPbSbSrCa-CuO etc.".
Hongbao "Superconducting Transition Above 150K in BiSbSrCaCuO System" preprint 12/5/88 Physica C.
Bednorz & Muller, Possible High Tc Superconductivity in the Ba-La-Cu-O System, Zeit. Phys. B., 64, 189–193 (1986).
Subramanian et al., A New High Temperature Superconductor: $Bi_2Sr_{3-x}Ca_xCu_2O_{8+y}$, Science, 239, 1015 (1988).
Gao et al, Bulk Superconductivity in $Tl_2CaBa_2Cu_2O_{8+\delta}$, Nature, 332, 623–624 (1988).
Wang et al, Comparison of Carbonate, Citrate, and Oxalate Chemical Routes to the High-Tc Metal Oxide Superconductors $La_{2-x}Sr\ CuO_4$, Inorg. Chem. 26, 1474–1476 (1987).
Mao, X. et al, The Influence of Pb Composition on the Upper Critical Magnetic Field of $Bi_{1.9-x}Pb_xSb_{0.1}Sr_2Ca_2Cu_3O_y$.
Liu, H. et al, Zero Resistance at 132° K. in the Multiphase System of $Bi_{1.9-x}Pb_xSb_{0.1}Sr_2Ca_2Cu_3O_y$. (Undated Preprint.).
Liu, H. et al, Superconducting Transition Above 160° K. in Bi-Pb-Sb-Sr-Ca-Cu-O System. (Undated Preprint.).
Liu, H. et al, Superconducting Properties in $(Bi_{2-x-y}Pb_xSb_y)Sr_2Ca_2Cu_3O_z(x=0, 0.1, 0.3, 0.5; y=0, 0.1)$. (Undated preprint.).
Liu, H. et al, The Superconducting Properties in $Bi_{2-x}Sb_xSr_2Ca_2Cu_3O_4$ Compounds, ($x=0.05, 0.1, 0.15, 0.2$). Physica C, 156, 804–806 (1988).
Voigt, J. A. et al, A Hydroxycarbonate Route to Superconductor Precursor Powders, paper available at Fall Meeting of Materials Research Soc., Boston, late Nov., 1987 (Sandia.).
Kaneko et al, "On the Precipitation Method for the Preparation of High Tc M-X-Cu-O (M=Ba, Sr, X=La, Y) System," Japanese Journal of Applied Physics, vol. 26, No. 5, May, 1987, pp. L734–L735.
Fujiki et al., "Preparation of High Tc-Y-Ba-Cu-O Superconductor Using Colloidal Methods," Jul., 1987, Japanese Journal of Applied Physics, pp. L 1159–1160.
Two Declarations under 37 CFR 1.131 from file of Bunker U.S. Pat. No. 4,839,339.

Primary Examiner—William R. Dixon, Jr.
Assistant Examiner—Chris Gallo
Attorney, Agent, or Firm—Wm. W. McDowell, Jr.

[57] ABSTRACT

Improved process for making Bi-Pb-Sb-Sr-Ca-Cu oxide superconductors. A solution of the nitrates of Bi, Pb, Sr, Ca, and Cu is reacted with a quaternary ammonium carbonate in a dispersion (heel) of $Sb_2O_5$. Carbonates of Bi, Pb, Sr, Ca, and Cu precipitate homogeneously on the $Sb_2O_5$ particles. Solids are recovered, dried, and heated to make a superconductor. The method minimizes handling toxic antimony compounds and reduces introduction of contaminants. Novel compositions result.

7 Claims, No Drawings

CERAMIC COMPOSITION

This is a continuation-in-part of Ser. No. 201,988 filed June 3, 1988, which is a continuation-in-part of co-pending application Ser. No. 155,340 filed Feb. 12, 1988, which is a continuation-in-part of application Ser. No. 095,083 filed Sept. 11, 1987, abandoned. The said three applications are herein incorporated by reference in their entireties.

FIELD OF THE INVENTION

This invention relates to the preparation of ceramics and more particularly to an improvement in preparing the metal oxide system known as Bi-Pb-Sb-Sr-Ca-Cu-O.

SUMMARY OF THE INVENTION

The invention involves co-precipitating carbonates of Bi, Pb, Sr, Ca and Cu onto finely divided nuclei of $Sb_2O_5$, in aqueous media, followed by recovering and drying the solids, then heating the dried solids to form the final ceramic product. Under preferred conditions the final product is superconducting.

More specifically, an aqueous solution of compounds of Bi, Pb, Sr, Ca and Cu is added slowly and simultaneously with an aqueous solution containing carbonate ions, to an aqueous suspension of $Sb_2O_5$ particles (i.e., a heel), whereby carbonates of the metals are co-precipitated onto the $Sb_2O_5$ particles. The solids are recovered, dried, and calcined. In the preferred process the result is superconducting.

The final fired product finds utility in the general field of ceramics, e.g., as insulators, glazes, circuit boards, superconductors, etc.

BACKGROUND OF THE INVENTION

It has long been known that the effective resistivity of certain metals was sometimes substantially eliminated when the metal was exposed to low temperature conditions. Of particular interest were the metals and metal oxides which can conduct electricity under certain low temperature conditions with virtually no resistance. These have become known as superconductors. Certain metals, for example, are known to be superconductive when cooled to about 4° on the Kelvin scale (°K.), and certain niobium alloys are known to be superconductive at about 15° K., some as high as about 23° K.

Discovery of superconductivity in the system La-Ba-Cu-O (J. G. Bednorz and K. A. Muller, *Zeit. Phys. B* 64, 189-193 [1986]) has stimulated the search for other systems, particularly with a view to substituting other elements for the rare earths (RE) used in the earlier materials. For example, replacement of RE by Bi and Tl has been reported. (See M. A. Subramanian et al.,) Science, 239, p. 1015 (1988); L. Gao et al., Nature, 332, pp. 623-624 (1988).

Wang et al., Comparison of Carbonate, Citrate, and Oxalate Chemical Routes to the High-$T_c$ Metal Oxide Superconductors $La_{2-x}Sr_xCuO_4$, Inorg. Chem. 26, 1474-1476 (1987) discloses a carbonate precipitation technique. The precipitant was $K_2CO_3$. According to the paper, it was necessary to wash the precipitate repeatedly, an obvious disadvantage in production work. Washing was necessary because potassium adversely affects superconductivity properties of the finished materials. Repeated washing removes strontium, a highly detrimental loss in the process.

From the technical viewpoint it may seem obvious that co-precipitated carbonates would provide enhanced homogeneity. However, the technical solution to the problem encounters serious difficulties. Thus the Wang et al process, using potassium carbonate (or sodium carbonate) necessitated numerous washings and apparently left detectable amounts of alkali in the ceramic base even so. As noted serial washings remove Sr, and would be unworkable in my process. Nor is it merely sufficient that the carbonate be derived from a cation that would burn off completely. For example, ammonium carbonate does not work, because a pH below 7 is required to prevent formation of copper tetraamine, but under these conditions bicarbonate ion is formed, with consequent formation of strontium bicarbonate, which, being slightly soluble, disrupts the desired stoichiometry. Quaternary ammonium carbonates, on the other hand, form the desired metal carbonates simply and cleanly as a coating on $Sb_2O_5$ particles without troublesome side-formation of complexes or coordination compounds, with firm and precise retention of the intended stoichiometry. The coated particles are readily recovered for further processing.

In the prior art, Bi-Pb-Sb-Sr-Ca-Cu-O superconductors have been made by heating together $Bi_2O_3$, CuO, $SrCO_3$, $CaCO_3$, PbO and $Sb_2O_5$ in air, at, e.g. 830° C. for 15 hours, followed by grinding, pelletizing, sintering at 880° C. for 12 hours, followed by furnace cooling in air. Processes of this type are disclosed in the following preprints:

Mao, X., et al, The Influence of Pb composition on the Upper Critical Magnetic Field of $Bi_{1.9-x}Pb_xSb_{0.1}Sr_2Ca_2Cu_3O_y$ system.

Liu, H. et al, Zero Resistance at 132° K. in the Multiphase System of $Bi_{1.9-x}Pb_xSb_{0.1}Sr_2Ca_2Cu_3O_y$ with x=0.3, 0.4.

Liu, H., et al, Superconducting Transition above 160° K. in Bi-Pb-Sb-Sr-Ca-Cu-O System.

Liu, H., et al, Superconducting Properties in $(Bi_{2-x-y}Pb_xSb_y)Sr_2Ca_2Cu_3O_z$ System (x=0, 0.1, 0.3, 0.5; y=0, 0.1).

A published article is similar but omits PbO:

Liu et al, The Superconducting Properties in $Bi_{2-x}Sb_xSr_2-Ca_2Cu_3O_4$ Compounds (x=0.05, 0.1 0.15, 0.2) *Physica C* 156, pp. 804-806 (1988).

DETAILED DESCRIPTION OF THE INVENTION

I start with three base liquids (all preferably made up with deionized water):

(1) Premix, an aqueous solution of soluble salts (e.g., nitrates, acetates, etc.) of Bi, Pb, Sr, Ca, and Cu the salts being present in amounts to provide an atomic ratio of $Bi_aPb_bSr_cCa_dCu_e$ where a, b, c, d, and e independently have a value within the range 0.1-10. Preferably, a=1.6, b=0.3, c=2, d=2, and e=3. Further description of the invention will use a solution of nitrates as exemplar.

(2) Solution of quaternary ammonium carbonate (described below);

(3) Aqueous dispersion of finely divided $Sb_2O_5$ nuclei ("heel"). Suitably the powder is fine enough so that at least about 90% passes through a 100 mesh U.S. screen, and slurried as a 0.01 to 1.0 weight % dispersion in water. The $Sb_2O_5$ is used in an amount so as to provide an atomic ratio of 0.01 to 1.0, preferably about 0.1, on the same basis as the individual metals in the premix.

Additionally, an aqueous solution of a quaternary ammonium hydroxide is used. This is added drip-wise to the heel during the course of the reaction to maintain the pH of the reaction mixture in the range of about 7-11. Below this pH some of carbonates (e.g., Sr) tend to redissolve as the bicarbonate.

The reaction is suitably carried out at room temperature. To start, the heel of the antimony oxide dispersion is stirred, and addition of the solution of the combined nitrates into the heel is begun. The addition is slow and is metered to match the addition of the quaternary ammonium carbonate, which is similarly metered. The reaction time will depend on the amount of materials being reacted. In Example 1, I added about 1 liter of nitrates and 1 liter of quaternary ammonium carbonate over a period of about half an hour, or about 17 ml of each solution per minute. The rate may go up with larger volumes of materials. However, under conditions of simultaneous addition, there will be little or no stoichiometric excess of either the nitrate solution or the carbonate solution in the heel at any time. Further, reaction of the reagents is almost instantaneous as added, and as a result, very little free metal ions or carbonate ions exist at any given moment.

The major component of the final reaction slurry is considered to be $Sb_2O_5$ particles coated with co-precipitated carbonates of Bi, Pb, Sr, Ca and Cu. Some carbonates may have coprecipitated separately, i.e., not onto the particles of antimony oxide. The precipitate may also contain minor amounts of hydroxides and hydroxycarbonates, depending on precipitation conditions.

This invention is particularly applicable to the system $Bi_aPb_bSb_fSr_cCa_dCu_eO_y$ where a=about 1.6, b=about 0.3, f=about 0.1, c=about 2, d=about 2, e=about 3, and Y=about 10.

The invention provides several novel compositions and processes:

Compositions (1) Premix Solution. This is an aqueous solution of the soluble salts of Bi, Pb, Sr, Ca, and Cu, the salts being present to provide atomic ratios as stated in the description of the premix, above.

(2) Aqueous slurry, the solids of which comprise particles of $Sb_2O_5$ nuclei coated with co-precipitated carbonates of Bi, Pb, Sr, Ca, and Cu as defined in (1).

(3) Finely-divided $Sb_2O_5$ nuclei coated with co-precipitated carbonates Bi, Pb, Sr, Ca, and Cu in the ratios as defined in (1) above.

(4) The fired mixture of (3) above, preferably under process conditions that provide a superconductor.

Comment

A point of novelty of the preferred form of Composition (4) vis-a-vis the prior art is that the Bi-Pb-Sb-Sr-Ca-Cu oxides are present in totally homogenized form in Composition (4).

Processes (5) Forming Composition (1) above, preferably by forming a solution of nitrates of Bi, Pb, Sr, Ca, and Cu, suitably to provide an atomic ratio of $Bi_aPb_bSr_cCa_dCu_e$ as above defined.

(6) Reacting the solution of (5) with a solution of quaternary ammonium carbonate in a heel of an aqueous dispersion of particles of $Sb_2O_5$ nuclei, at a pH of about 7-11, so as to form a co-precipitate of carbonates of Bi, Pb, Sr, Ca and Cu on the $Sb_2O_5$ nuclei; and recovering the resulting solids.

(7) Drying the solids of (6). Drying can be done in an oven (cf. Example 1), or (preferably) by spray drying, or by spraying the slurry onto a heated drum, or by substantially any conventional means.

(8) Calcining the dried mixture of (7). Preferably, prior process conditions are selected so that the product of calcining is a superconductor. In general, firing the dried mixture in air, suitably in stages, for about 1-1000 hours at temperatures up to about 800°-890° C., followed by cooling to room temperature, will result in a superconductor.

The invention offers several closely related contributions to the art: (1) total homogeneity of the oxide product; (2) minimal handling and evaporation of toxic Sb compounds; (3) zero to minimal Sb loss during heating and therefore better control of stoichiometry; and (4) minimal introduction of impurities.

I use the term "homogeneous" to mean dispersion so fine that it is practically at the atomic level. This is the type of homogeneity that results when the final reaction slurry is dried and the dried product is calcined. For example, the final Bi-Pb-Sr-Ca-Cu-O product is characterized by substantially total homogeneity.

The Carbonate Reagent

A solution of quaternary ammonium carbonate is conveniently prepared by bubbling $CO_2$ through an aqueous solution of a quaternary ammonium hydroxide until the quaternary carbonate is stoichiometrically formed and $CO_2$ is dissolved in excess. The preferred quaternary ammonium hydroxides have the formula:

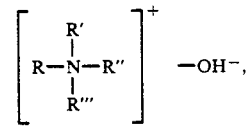

where R, R', R", R''' are the same or different members of the group
(i) alkyl, e.g., tetramethylammonium hydroxide, tetraethylammonium hydroxide, tetrapropylammonium hydroxide, dimethyldiethylammonium hydroxide, cyclopropyltrimethylammonium hydroxide and the like;
(ii) aromatic, e.g., phenyltrimethylammonium hydroxide, phenylethyldimethylammonium hydroxide, benzyltrimethylammonium hydroxide, and the like;
(iii) heterocyclic;
(iv) and any two group members may be joined in a ring whereby N becomes a ring member, e.g., dimethyl pyrrolidnium hydroxide, dimethylpyridinium hydroxide, and the like.

The quaternary carbonate corresponding to the above quaternary hydroxide is of course

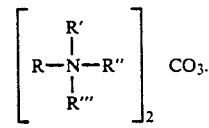

Use of the quaternaries permits: (i) facile pH control (essential for co-precipitation of the carbonates); (ii) exclusion of additional metals, such as in potassium carbonate as used in prior carbonate processes; (iii) ready burn-off of the carbonate source in the furnace; and (iv) stoichiometric co-precipitation, without formation of interfering complexes or coordination compounds.

Composition 1—The Premix Solution

This solution is made up by dissolving the required Bi-Pb-Sr-Ca-Cu nitrates, acetates, or other soluble salts in water, so as to provide the predetermined atomic ratio for the metals in the finished superconductor, as stated.

The Heel

The heel is prepared simply by dispersing finely divided $Sb_2O_5$ nuclei into water, in a vessel equipped with stirrer and large enough to accommodate the anticipated addition of soluble salt (e.g., nitrate) and quaternary ammonium carbonate solutions. I prefer that the slurry heel at start comprise about 0.05–0.03 weight % $Sb_2O_5$.

A small amount (e.g., about 0.1 weight %) of an organic surfactant may be added to aid dispersion.

The Co-carbonate Slurry

The premix solution and the quaternary ammonium carbonate are added slowly, simultaneously, at constant rates, with stirring, to the heel of slurry. The two reactant solutions and the heel are suitably each about the same starting volume. The pH should be maintained at about 7–11, suitably at about 9–10, during carbonate co-precipitation. Suitably this is done by drip-wise addition of a quaternary ammonium hydroxide. Such quaternary may have the structure of quaternary ammonium hydroxide as above defined.

The solids can be recovered from the slurry using various techniques. On a laboratory scale simple filtration followed by air drying or oven drying is adequate for good homogeneity.

In the preferred embodiment, at all times during the reaction the resulting slurry will be found to contain $Sb_2O_5$ particles coated with carbonates of Bi, Pb, Sr, Ca, and Cu; quaternary ammonium cations; nitrate ions residual from the starting nitrate salts, stoichiometrically equivalent to the co-precipitated carbonates; and water (balance). This slurry is believed novel. It is per se an essential part of the invention. At the conclusion of the carbonate precipitation, the solids will consist of carbonates of Bi, Pb, Sr, Ca, and Cu on $Sb_2O_5$ in a predetermined atomic ratio, as above defined. The dried solids recovered from this slurry are ready to calcine to make a superconductor or other ceramic product characterized by substantial homogeneity. Calcination converts the carbonates to oxides and removes any residual nitrates, moisture, or organic material.

The following Example illustrates without limiting the invention.

EXAMPLE 1

Carbonate Precipitation:

$Bi_{1.6}Pb_{0.3}Sb_{0.1}Sr_2Ca_2Cu_3O_y$. The following were placed in 900 ml water in a 2 L beaker:

38.8 g $Bi(NO_3)_3$, $5H_2O$
4.97 g $Pb(NO_3)_2$
23.61 g $Ca(NO_3)_2$ $4H_2O$
21.16 g $Sr(NO_3)_2$
34.89 g $Cu(NO_3)_2$, $2\frac{1}{2} H_2O$ About 45 ml conc. $HNO_3$ were added to aid dissolution. The soluton was stirred overnight, resulting in a clear blue solution, pH = −0.22.

In a separate 2 L, beaker were placed 400 ml of tetramethylammonium carbonate [$(TMA)2CO_3$] (pH = 10.00). This solution was diluted to the 1 L mark with deionized water.

In a 4 L beaker was placed 1000 ml deionized water carrying 0.81 g $Sb_2O_5$ in suspension. This suspension is used on a "heel" to receive the other reactants. The 5-metal nitrate solution and the $(TMA)_2CO_3$ solution were dripped into the $Sb_2O_5$ heel. The pH of which was continuously monitored and maintained at about 9 by dripping neat trimethylammonium hydroxide (TMAOH) from a 500 ml burette into it as needed. Time required to complete the nitrate and $(TMA)_2CO_3$ additions, 30 minutes. During this time a total of 425 ml neat TMAOH were needed to keep the pH at 9.01.

The reaction mixture (a suspension of $Sb_2O_5$ particles associated with preciptant carbonates, Bi, Pb, Sr, Ca, and Cu) was stirred for 20 minutes for aging purposes. The suspension was filtered, and the semi-dry filter cake was dried overnight at 110° C.

Heat Treatment

The above dry filter cake was heated at about 540° C. for 5 hours in air, then allowed to cool. It was heated at 800° C. for 12 hours in air, then allowed to cool. Samples were ground and pelletized (at 20,000 psi). The pellets weighed 2–3 g. The pellets were heated at 850° C. for 60 hours, then cooled over 8 hours to 350° C., at which the furnace was turned off.

Magnetic susceptibility measurements showed the pellets to be superconducting, with $T_c$ = about 110K.

From the foregoing description it will be evident that the process introduces no extraneous substances into the system; viz., no cations other than Bi, Pb, Sb, Sr, Ca, and Cu enter the system. The process thus results in an oxide mix of extraordinary purity at all stages.

Extraneous Materials

Prior art processes conveniently enhance homogeneity by grinding the calcined intended superconductor, followed by recalcining. In some instances this sequence may be repeated several times. It is known that improved homogeneity in the general case enhances superconductivity. The problem here is that effective grinding inevitably and inherently introduces impurities into the ceramic, simply by impacting the ceramic between the balls and walls (or other grinding surfaces) of the grinding mill. It is known, for example, that silica or stainless steel balls in a ball mill lose significant mass over a period of use. This mass of course disappears into whatever was being milled. Mills that comminute by particle self-impact lose metal by wall-scouring, particularly in the area of stream entry. If the product is ground in a ball mill using quartz or silica balls, some of the impurity is silica.

Thus, the firing-grinding-refiring technique rapidly achieves a balance: Improvement in homogeneity tends to be matched by contamination build-up that cancels part or all of the improvement.

As above described, my process minimizes the grinding problem in the general case. The oxide product can of course be subjected to the conventional grinding-shaping-refiring cycle, but this is superfluous.

I claim:

1. Aqueous slurry, the solids of which comprise particles of $Sb_2O_5$ nuclei coated with co-precipitated carbonates of Bi, Pb, Sr, Ca, and Cu in an atomic ratio of $Bi_aPb_bSb_fSr_cCa_dCu_e$ where a, b, c, d, and e independently have a value within the range 0.1–10, and f a value of 0.01–1.0.

2. Aqueous slurry according to claim 1 where a is about 1.6; b is about 0.3; f is about 0.1; c is about 2; d is about 2, and e is about 3.

3. The dried solids of claim 1.

4. The dried solids of claim 2.

5. Composition consisting essentially of carbonates of Bi, Pb, Sr, Ca, and Cu co-precipitated on particles of $Sb_2O_5$ nuclei, in atomic ratios of $Bi_aPb_bSb_fSr_cCa_dCu_e$ where a, b, c, d, and e independently have a value within the range 0.1–10, and f a value of 0.01–1.0.

6. Composition according to claim 5, where a is about 1.6, b is about 0.3, f is about 0.1, c is about 2, d is about 2, and e is about 3.

7. Process comprising:

(A) preparing a pre-mix comprising dissolving nitrates of Bi, Pb, Sr, Ca, and Cu in water in amounts to provide atomic ratios of $Bi_a$ $Pb_b$ $Sr_c$ $Ca_d$ $Cu_e$ where a is about 1.6, b is about 0.3, c is about 2, d is about 2, and e is about 3, (B) preparing a heel comprising particles of $Sb_2O_5$ dispersed in water, the $Sb_2O_5$ being provided in an amount to give an Sb atomic ratio of about 0.1 with respect to the ratios in (A), (C) adding an aqueous solution of tetramethyl ammonium carbonate to (B) and simultaneously adding (A) to (B), both at controlled addition rate so as to coprecipitate the carbonates of Bi, Pb, Sr, Ca, and Cu onto the $Sb_2O_5$ particles without introducing any substantial stoichiometric excess of (A) or tetramethyl ammonium carbonate into (B); while maintaining a pH of about 9–10 in the reaction solution;

(D) recovering and drying the resulting solids; and (E) calcining the solids.

* * * * *